(12) United States Patent
Fukakusa et al.

(10) Patent No.: US 9,375,913 B2
(45) Date of Patent: Jun. 28, 2016

(54) SCREEN PRINTER HAVING STRUCTURE FOR SOLDER AMOUNT ESTIMATION

(71) Applicant: FUJI MACHINE MFG. CO., LTD., Chiryu (JP)

(72) Inventors: Shoji Fukakusa, Yokkaichi (JP); Yoshimune Yokoi, Kiyosu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/785,475

(22) PCT Filed: May 14, 2013

(86) PCT No.: PCT/JP2013/063440
§ 371 (c)(1),
(2) Date: Oct. 19, 2015

(87) PCT Pub. No.: WO2014/184877
PCT Pub. Date: Nov. 20, 2014

(65) Prior Publication Data
US 2016/0067954 A1 Mar. 10, 2016

(51) Int. Cl.
*B41F 15/40* (2006.01)
*B41F 15/42* (2006.01)
*B41F 15/12* (2006.01)
*H05K 3/34* (2006.01)

(52) U.S. Cl.
CPC ............. *B41F 15/12* (2013.01); *B41F 15/42* (2013.01); *H05K 3/34* (2013.01)

(58) Field of Classification Search
CPC .... B41F 15/08; B41F 15/0881; B41F 15/423; B41F 15/42; B41F 15/44; B41F 15/40; B41F 15/46

USPC .......................................................... 101/123
See application file for complete search history.

(56) References Cited

U.S. PATENT DOCUMENTS

| 2012/0138664 A1* | 6/2012 | Sumioka | B41F 15/0881 228/102 |
| 2014/0115874 A1* | 5/2014 | Narita | B41F 15/0881 29/593 |

FOREIGN PATENT DOCUMENTS

| JP | 07205403 A | * | 8/1995 |
| JP | 2008-74054 A | | 4/2008 |

OTHER PUBLICATIONS

International Search Report issued Jun. 11, 2013 in PCT/JP2013/063440 filed May 14, 2013.
Supplementary European Search Report, dated Apr. 11, 2016, issued in Application No. 13884841.1.

* cited by examiner

*Primary Examiner* — Leslie J Evanisko
(74) *Attorney, Agent, or Firm* — Oblon, McClelland, Maier & Neustadt, L.L.P.

(57) ABSTRACT

A screen printer in which a photoelectric sensor and squeegees are fixed to a slider, when outward movement printing in which solder on a screen is rolled by an outward movement of the right squeegee is completed, the right squeegee is separated from a state of contacting a right end of a solder roll and a squeegee position p1 at that time is input, and, subsequently, the slider is returned until the photoelectric sensor detects a left end of the solder roll and a squeegee position p2 at this time is input. An amount (a solder roll width) of solder remaining on the screen is calculated by subtracting a movement amount from the squeegee position p1 to the squeegee position p2 from a distance from the right squeegee to an optical axis position of the photoelectric sensor on the screen.

2 Claims, 7 Drawing Sheets

(a) OUTWARD MOVEMENT PRINTING COMPLETED (b) START RETURN MOVEMENT (c) DETECT SOLDER

SOLDER ROLL WIDTH
R=X−S (d) RETURN MOVEMENT PRINTING START

SCREEN PRINTER HAVING STRUCTURE FOR SOLDER AMOUNT ESTIMATION

TECHNICAL FIELD

The present disclosure relates to a screen printer which performs printing by moving solder which is placed on a screen using a squeegee.

BACKGROUND ART

In the related art, as this type of screen printer, there is proposed a screen printer in which a reflective photoelectric switch is attached to a squeegee holding device which can be moved parallel to the screen while holding a squeegee, and the screen printer measures an amount of solder on the screen based on a detection signal from the photoelectric switch (for example, refer to PTL 1). In this screen printer, when the printing is completed, the squeegee holding device is moved along the screen such that an optical axis of the photoelectric switch passes through the solder, and an interval (a movement distance) between two positions at which the detection signal of the photoelectric switch changes is calculated as a solder roll width, that is, the solder amount.

PTL 1: JP-A-2008-74054

SUMMARY

However, in the device described above, since the squeegee holding device is moved such that the optical axis of the photoelectric switch passes through the solder, the measurement time of the solder amount becomes longer by the amount of the movement time. Since the solder amount on the screen greatly influences the print quality, it is desirable to perform the measurement of the solder amount as frequently as possible (for example, every time the printing is performed once); however, since the printing amount per unit time is decreased when the measurement time increases, it is difficult to perform the measurement of the solder amount frequently.

The main object of the screen printer of the present disclosure is to shorten the measurement time of the solder amount.

The screen printer of the present disclosure adopts the following means in order to achieve the above-described main object.

The screen printer of the present disclosure is a screen printer which performs printing by moving solder which is placed on a screen using a squeegee, and the screen printer includes: a head, on which the squeegee is mounted; parallel movement device for causing the head and the screen to move relatively in a direction parallel to the screen; perpendicular movement device for causing the head and the screen to move relatively in a direction perpendicular to the screen; position detection device for detecting a relative position between the squeegee and the screen; optical detection device which is provided such that an optical axis position is capable of moving relative to the screen due to the parallel movement device, and which is for detecting the screen and the solder at the optical axis position in distinction form each other; printing completion time control device for, when printing is completed, controlling the perpendicular movement device such that the squeegee and the screen move relatively in a direction perpendicular to the screen to a position at which the squeegee is at least separated from a state of being in contact with one end side of the solder in a printing direction, and, after the controlling is performed, controlling the parallel movement device such that the head and the screen move relatively in a direction parallel to the screen until at least another end side of the solder in the printing direction is detected by the optical detection device; and solder amount estimation device for estimating an amount of solder on the screen based on the relative position between the squeegee and the screen which is detected by the position detection device when the printing is completed, and the relative position between the squeegee and the screen which is detected by the position detection device when the other end of the solder in the printing direction is detected by the optical detection device.

In the screen printer of the present disclosure, optical detection device is provided such that an optical axis position is capable of moving relative to the screen, and which is for detecting the screen and the solder at the optical axis position in distinction from each other, when the printing is completed, the head and the screen are caused to move relatively in a direction perpendicular to the screen to a position at which the squeegee is at least separated from a state of being in contact with the one end side of the solder in the printing direction, and, subsequently, the head and the screen are caused to move relatively in a direction parallel to the screen until at least the other end side of the solder in the printing direction is detected by the optical detection device. The amount of solder on the screen is estimated based on the relative position between the squeegee and the screen when the printing is completed, and the relative position between the squeegee and the screen when the other end of the solder in the printing direction is detected by the optical detection device. Accordingly, since it is possible to shorten the movement distance of the optical detection device in comparison to moving the optical detection device such that the optical axis totally passes through the solder, it is possible to shorten the movement time. As a result, it is possible to further shorten the measurement time of the solder amount.

In the screen printer of the present disclosure, which, as the squeegee, is provided with a first squeegee and a second squeegee which are disposed such that contact surfaces with the solder face each other, and which repeats an operation of performing printing by causing the first squeegee to contact the solder and causing the head and the screen to move relatively in a first direction, and, after the printing, performing a next printing by causing the second squeegee to contact the solder and causing the head and the screen to move relatively in a second direction which is a reverse of the first direction, in which it is possible to provide the optical detection device such that, when the printing by the first squeegee is completed and the head and the screen are moved relatively until the other end side of the solder in the printing direction is detected by the optical detection device, the other end side of the solder in the printing direction is positioned in a vicinity below the second squeegee. By doing this, it is possible to shorten the time from when the estimation of the solder amount is completed to when the next printing is started, and it is possible to increase the printing amount per unit time.

DESCRIPTION OF EMBODIMENTS

Next, an embodiment for carrying out the present disclosure will be described.

Figure 1:
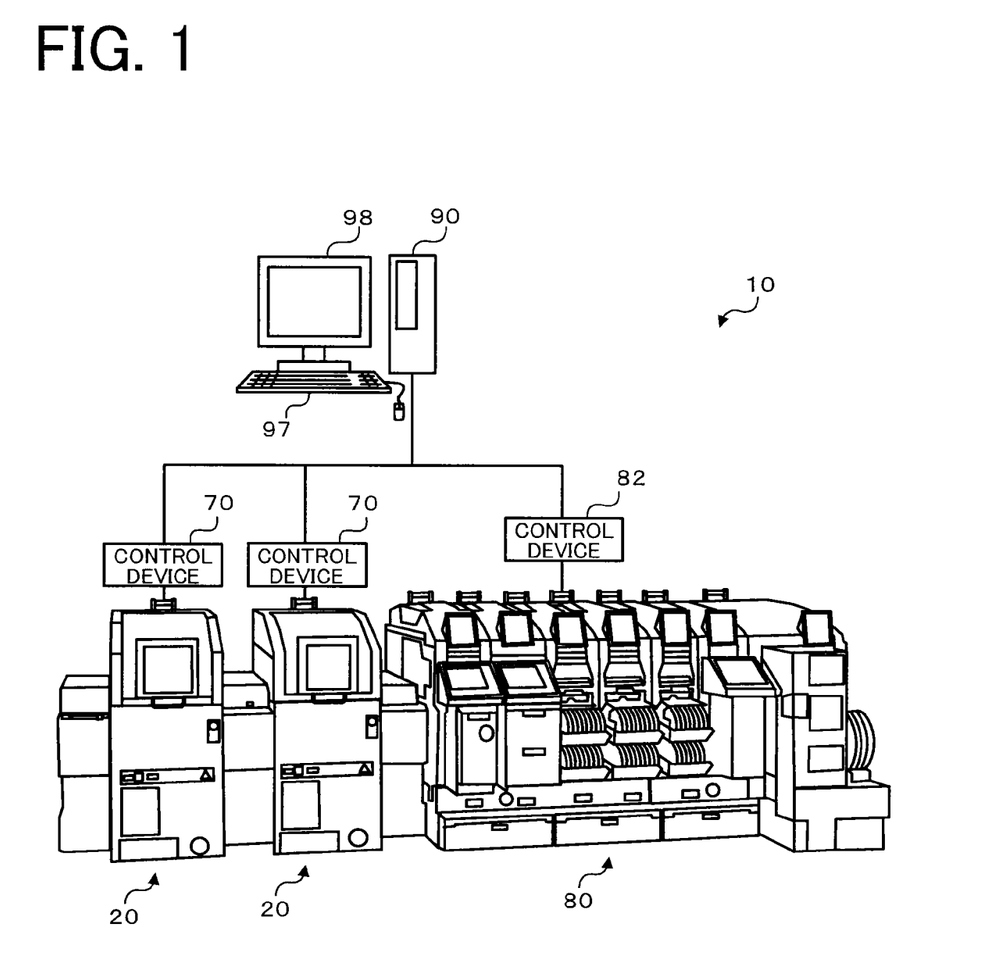
FIG. 1 is a perspective view illustrating the appearance of a component assembly system 10.
Figure 2:
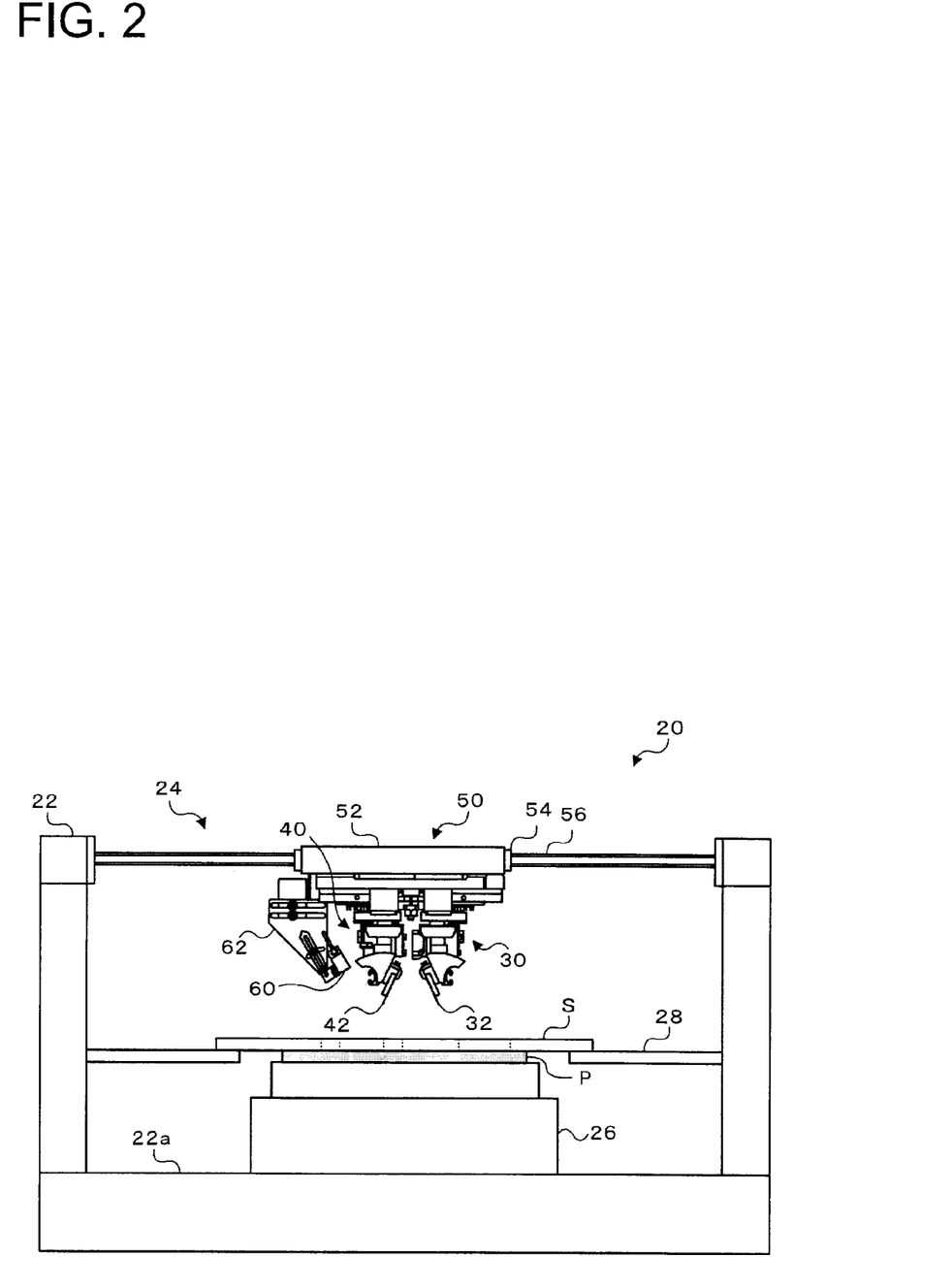
FIG. 2 is a structural view schematically illustrating the structure of a screen printer 20 of the present embodiment which is mounted on the component assembly system 10.
Figure 3:
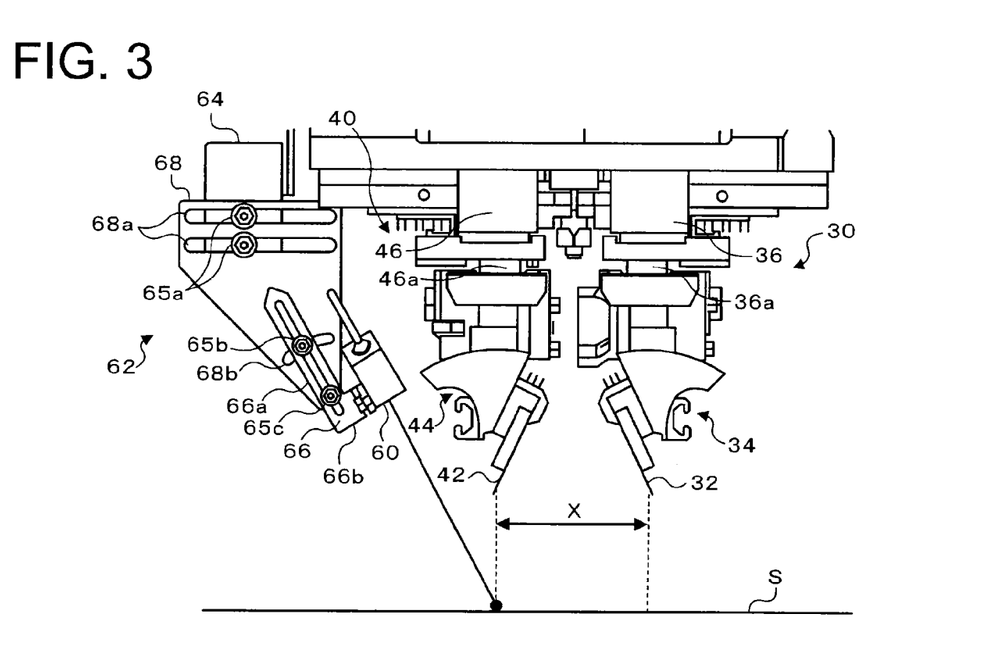
FIG. 3 is a structural view schematically illustrating the structure of squeegee units 30 and 40.
Figure 4:
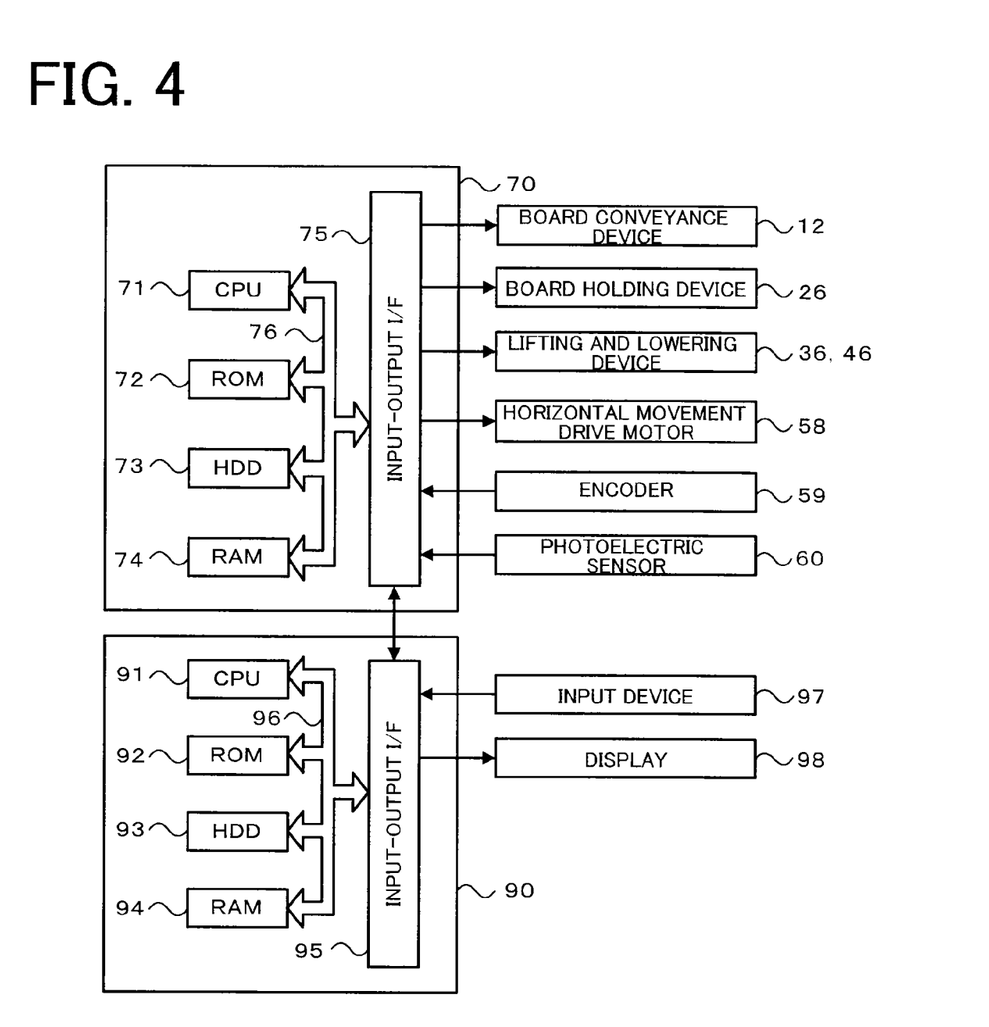
FIG. 4 is a block diagram illustrating the electrical connection relationship between a management computer 90 and the screen printer 20.

FIG. 1 is a perspective view illustrating the appearance of the component assembly system 10, FIG. 2 is a structural view schematically illustrating the structure of the screen printer 20 as an embodiment of the present disclosure which is mounted on the component assembly system 10, FIG. 3 is a structural diagram schematically illustrating the structure of the squeegee units 30 and 40, and FIG. 4 is a block diagram illustrating the electrical connection relationship between the management computer 90 and the screen printer 20.

As illustrated in FIG. 1, the component assembly system 10 is provided with a plurality of (in the present embodiment, two) the screen printers 20 which form a circuit pattern on a circuit board P (refer to FIG. 2) using screen printing, control devices 70 which control the screen printers 20, a plurality of (in the present embodiment, seven) electronic component mounting machines 80 which mount electronic components on the circuit boards P on which circuit patterns are formed by the screen printers 20, a control device 82 which controls the electronic component mounting machines 80, and the management computer 90 which manages each of the control devices 70 and 82. The circuit board P is transported by a board conveyance device 12 (refer to FIG. 4), and the plurality of screen printers 20 and the plurality of electronic component mounting machines 80 are lined up and arranged such that the screen printers 20 are closer to the upstream side than the electronic component mounting machines 80 on the transport path with regard to the transport direction of the circuit board P. Here, the plurality of screen printers 20 all have the same structure, and thus are assigned the same symbols. Since the plurality of electronic component mounting machines and the control devices thereof are not the subject matter of the present disclosure, the symbols "80" and "82" are assigned collectively thereto, and detailed description thereof will be omitted.

The screen printer 20 of the present example is configured to apply (print) solder onto the circuit board P below via pattern holes by pressing the solder into the pattern holes which are formed in a screen S while rolling the solder on the screen S using squeegees 32 and 42 (refer to FIG. 3) as the previous process to the process of mounting electronic components using the electronic component mounting machine 80, and, as illustrated in FIG. 2, is provided with a housing 22, and a printer main body 24 which is installed in the housing 22. Here, the left-right direction of FIG. 2 is the printing direction, and the forward (front)-backward (rear) direction indicates the transport direction of the circuit board P.

As illustrated in FIG. 2, the printer main body 24 is provided with a board holding device 26 which is installed on a base portion 22a which is a bottom portion of the housing 22 and holds the circuit board P which is transported from the rear to the front in FIG. 2, a screen support table 28 which is installed on the middle portion of the housing 22 and supports the screen S in a horizontal orientation, the left-right pair of squeegee units 30 and 40 which are installed on the top portion of the housing 22, a horizontal movement device 50 which moves the pair of squeegee units 30 and 40 in the horizontal direction (the left-right direction in FIG. 2) along the screen S, and a photoelectric sensor 60 which is for detecting the solder on the screen S.

As illustrated in FIG. 3, the squeegee units 30 and 40 are respectively provided with the squeegees 32 and 42 which are provided as rectangular plate-shaped members, squeegee heads 34 and 44 which are provided as squeegee holding members which hold the squeegees 32 and 42 in a state of being inclined by a predetermined angle with respect to the screen S, and lifting and lowering devices 36 and 46 which lift and lower the squeegees 32 and 42 via the squeegee heads 34 and 44. In the present embodiment, the squeegees 32 and 42 are disposed such that the contact surfaces thereof with the solder roll face each other, and are configured as a double squeegee capable of reciprocating printing by moving reciprocatively in a direction orthogonally intersecting the longitudinal direction. Note that, hereinafter, the squeegee 32 which is disposed on the right side of FIG. 3 will also be referred to the right squeegee, and the squeegee 42 which is disposed on the left side of FIG. 3 will also be referred to the left squeegee. The squeegee heads 34 and 44 are configured such that the squeegees 32 and 42 may be detachably attached, and in the present embodiment, that it is possible to adjust an inclination angle (a squeegee angle) with respect to the screen S. In the present embodiment, the lifting and lowering devices 36 and 46 are configured as air cylinders capable of pushing piston rods 36a and 46a downward using air pressure, and the squeegee heads 34 and 44 are fixed to the distal end portions of the piston rods 36a and 46a.

As illustrated in FIG. 2, the horizontal movement device 50 is configured as a linear feeding mechanism provided with a slider 52 to which the squeegee units 30 and 40 are fixed, a ball screw nut 54 which is attached to the slider 52, a screw shaft 56 which penetrates the inside of the ball screw nut 54 in an axial direction, and a horizontal movement drive motor 58 (refer to FIG. 4) the rotating shaft of which is connected to the screw shaft 56. The screw shaft 56 is disposed to be in a direction orthogonally intersecting the transport direction of the circuit board P and a direction parallel to the screen S, a guide rail which guides the movement of the slider 52 and is not shown is disposed parallel to the screw shaft 56. As described earlier, since the squeegee units 30 and 40 are fixed to the slider 52, it is possible to move the squeegee units 30 and 40 in a direction orthogonally intersecting the transport direction of the circuit board P and a direction parallel to the screen S by driving the horizontal movement drive motor 58. The horizontal movement drive motor 58 is configured as a servomotor capable of driving of both forward and reverse rotation, moves the squeegee units 30 and 40 in an outward movement direction (the leftward direction in FIG. 2) during forward rotation driving, and moves the squeegee units 30 and 40 in a return movement direction (the rightward direction in FIG. 2) during reverse rotation driving. An encoder 59 (refer to FIG. 4) for detecting a movement position of the slider 52 in the horizontal direction (the printing direction), that is, the movement position of the squeegees 32 and 42 is also provided in the horizontal movement device 50.

In the present embodiment, the photoelectric sensor 60 is configured as a reflective photoelectric sensor which includes a light projector and a light receiver, and detects the presence or absence of an object (a solder roll) on the screen S by receiving the reflected light of light which is projected from the light projector toward the screen S with the light receiver. Here, the respective reflectances of the surface of the screen S and the solder roll are different. Therefore, when the photoelectric sensor 60 receives the reflected light of the light which is projected from the light projector with the light receiver, based on the amount of received light thereof, the photoelectric sensor 60 can detect the presence or absence of the solder roll at the light projection position (the optical axis position) on the screen S.

The photoelectric sensor 60 is fixed to the slider 52 via a fixture tool 62, and moves integrally with the squeegee units 30 and 40 together with the movement of the slider 52. As illustrated in FIG. 3, the fixture tool 62 is provided with a rectangular fixing member 64 which is fixed to the slider 52, an L-shaped fixing member 66 which includes a long portion 66a and a short portion 66b and in which the photoelectric sensor 60 is fixed to the short portion 66b, and a fixture tool main body 68 the top portion of which is attached to the fixing member 64 and the bottom portion of which is attached to the fixing member 66. In the fixture tool main body 68, two long holes 68a are formed in the top portion in the horizontal direction, and the fixing member 64 is attached via the long holes 68a using bolts 65a. In the fixture tool main body 68, an arc hole 68b and a round hole are formed in the bottom portion, and the long portion 66a of the fixing member 66 is attached via the arc hole 68b and the round hole using respective bolts 65b and 65c. Therefore, it is possible to adjust the setting position of the photoelectric sensor 60 in the horizontal direction (the printing direction) depending on the position of the long holes 68a at which the bolts 65a are fixed, and it is possible to adjust the optical axis angle of the photoelectric sensor 60 with respect to the screen S depending on the position of the arc hole 68b at which the bolt 65b is fixed. In the present embodiment, the photoelectric sensor adjusts the horizontal position and the optical axis position such that the optical axis position on the screen S is positioned below the left squeegee 42. The reason to do this will be described later.

As illustrated in FIG. 4, the control device 70 is configured as a microprocessor centered on a CPU 71 and is provided with a ROM 72 which stores process programs, an HDD 73 which stores various data, a RAM 74 which is used as a working region, an input-output interface 75 for communicating electrical signals with an external device, and the like, and these are electrically connected via a bus 76. A detection signal from the photoelectric sensor 60, a detection signal from the encoder 59, and the like are input to the control device 70 via the input-output interface 75. From the control device 70, the drive signal to the board conveyance device 12, the drive signal to the board holding device 26, the drive signal to the horizontal movement drive motor 58, the drive signals to the lifting and lowering devices 36 and 46, and the like are output via the input-output interface 75. The control device 70 is connected to be capable of mutual communication with the management computer 90, and control commands and data are communicated therebetween.

As illustrated in FIG. 4, the management computer 90 is configured as a microprocessor centered on a CPU 91 and is provided with a ROM 92 which stores process programs, an HDD 93 which stores manufacturing plans of the circuit board P and the like, a RAM 94 which is used as a working region, an input-output interface 95 for communicating electrical signals with an external device, and the like, and these are electrically connected via a bus 96. The management computer 90 receives input of operation signals from an input device 97 which is represented by a mouse or a keyboard via the input-output interface 95, and outputs various images to a display 98 via the input-output interface 95. Here, the manufacturing plans of the circuit board P refer to plans defining what type of circuit pattern to be formed on the circuit board P in each of the screen printers 20, which electronic components to be mounted on the circuit board P in each of the electronic component mounting machines 80, how many circuit boards P (assembled products) with the electronic components mounted thereon to be manufactured, and the like. The management computer 90 receives the manufacturing plans from an operator via the input device 97, and transmits various commands to the screen printers 20 and the electronic component mounting machines 80 such that the assembled product is manufactured according to the received manufacturing plans.

Figure 5:
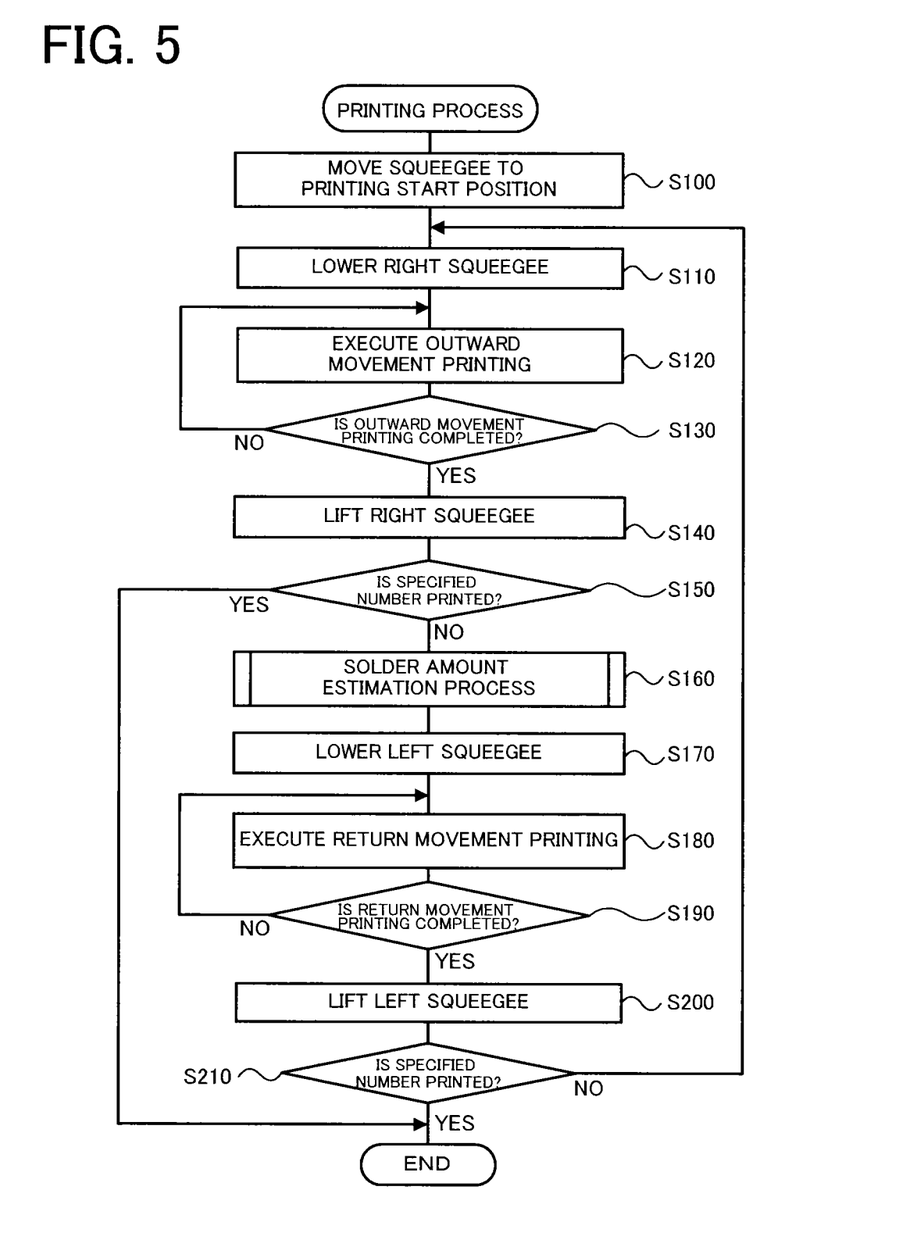
FIG. 5 is a flowchart illustrating an example of a printing process routine.

Next, description will be given of the operations of the screen printer 20 of an embodiment which is configured in this manner. FIG. 5 is a flowchart illustrating an embodiment of a printing process routine which is executed by the CPU 71 of the control device 70. The routine is executed when the screen printing commands are received from the management computer 90.

When the printing process routine is executed, first, the CPU 71 of the control device 70 performs drive control of the horizontal movement drive motor 58 such that the right squeegee 32 moves to a printing start position (step S100). Subsequently, the lifting and lowering device 36 is subjected to drive control such that the right squeegee 32 is lowered until coming into contact with the screen S (step S110), the right squeegee 32 is moved outward (moved in the leftward direction in FIG. 2) by subjecting the horizontal movement drive motor 58 to forward rotation driving, and outward movement printing which prints the solder on the circuit board P which is transported thereto by the board conveyance device 12 is executed (step S120). When the outward movement printing is completed (step S130), the lifting and lowering device 36 is subjected to drive control such that the right squeegee 32 rises to a separated position from a state of contacting one end (a right end) R1 of the solder roll in the printing direction (step S140), and it is determined whether or not the printing of the instructed number from the management computer 90 is completed (step S150). When it is determined that the printing of the instructed number is completed, the printing process is completed, and when it is determined that the printing of the instructed number is not completed, the solder amount estimation process is executed (step S160). Here, the solder amount estimation process is a process for estimating the amount (the solder roll width R) of the solder remaining on the screen S using the photoelectric sensor 60, and is performed by executing the solder amount estimation process of FIG. 6 which will be described later.

When the solder amount estimation process is executed, the lifting and lowering device 46 is subjected to drive control such that the left squeegee 42 is lowered until coming into contact with the other end (the left end) R2 of the solder roll in the printing direction (step S170), the left squeegee 42 is returned (moved in the rightward direction in FIG. 2) by subjecting the horizontal movement drive motor 58 to reverse rotation driving, and return movement printing which prints the solder on the circuit board P which is next transported thereto is executed (step S180). When the return movement printing is completed (step S190), the lifting and lowering device 46 is subjected to drive control such that the left squeegee 42 rises to a separated position from a state of contacting the left end R2 of the solder roll (step S200), and it is determined whether or not the printing of the instructed number from the management computer 90 is completed (step S210). When it is determined that the printing of the instructed number is not completed, the process returns to step S110 and the outward movement printing is executed on the circuit board P which is next transported thereto (steps S110 to S140), and when it is determined that the printing of the instructed number is completed, the printing process is completed.

Figure 6:
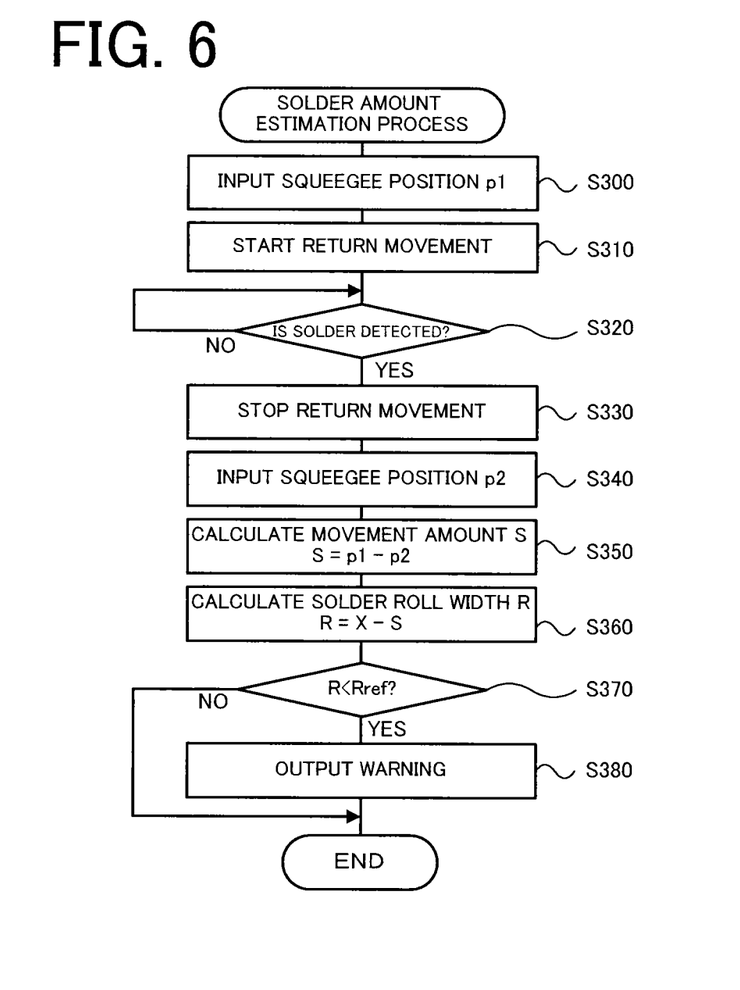
FIG. 6 is a flowchart illustrating an example of a solder amount estimation process routine.

Next, description will be given of the solder amount estimation process of FIG. 6. In the solder amount estimation process, first, a squeegee position p1 which is the position of the squeegees 32 and 42 when the outward movement printing is completed is input from the encoder 59 (step S300). Subsequently, the horizontal movement drive motor 58 is subjected to reverse rotation driving to start the return movement of the slider 52 (step S310), and the process waits for the photoelectric sensor 60 to detect the left end R2 of the solder roll (step S320). As described earlier, since the photoelectric sensor 60 is fixed to the slider 50 with the squeegees 32 and 42, when the slider 50 moves, the photoelectric sensor 60 also moves together therewith. When the photoelectric sensor 60 detects the left end R2 of the solder roll, the return movement of the slider 52 is stopped (step S330), and a squeegee position p2 which is the position of the squeegees 32 and 42 when the photoelectric sensor 60 detects the left end R2 of the solder roll is input from the encoder (step S340).

When the squeegee positions p1 and p2 are input, a movement amount S(=p1−p2) of the squeegees 32 and 42 is calculated by subtracting the squeegee position p2 from the squeegee position p1 (step S350), and the solder roll width R is calculated using the following equation (1) based on the calculated movement amount S (step S360). Here, "X" in the equation (1) indicates the horizontal distance from the right squeegee 32 to the optical axis position of the photoelectric sensor 60 on the screen S. Since the right squeegee 32 and the photoelectric sensor 60 are both fixed to the slider 52, it is possible to obtain the distance X in advance. In the present embodiment, instead of moving the photoelectric sensor 60 such that the optical axis passes through the right end R1 and the left end R2 of the solder roll and directly estimating the solder roll width R from the movement amount, the photoelectric sensor 60 is disposed such that the optical axis on the screen S is positioned at a position which is separated by the distance X from the right squeegee 32 which contacts the right end R1 of the solder roll, and the solder roll width R is estimated by subtracting, from the distance X, the movement amount S of the photoelectric sensor 60 until the left end R2 of the solder roll is detected by the photoelectric sensor 60. At this time, by causing the distance X to approach the solder roll width R as much as possible, since it is possible to shorten the movement distance of the photoelectric sensor 60 (the slider 52) until the photoelectric sensor 60 detects the left end R2 of the solder roll, it is possible to reduce the execution time of the solder amount estimation process.

When the solder roll width R is calculated in this manner, it is determined whether or not the calculated solder roll width R is less than a threshold Rref (step S370). Here, the threshold Rref is defined in advance in the vicinity of the minimum value within an appropriate range of solder amounts at which it is possible to stably perform the screen printing. When it is determined that the solder roll width R is greater than or equal to the threshold Rref, it is determined that the solder on the screen S is within an appropriate range, and the solder amount estimation process is completed, and, when it is determined that the solder roll width R is less than the threshold Rref, it is determined that the solder on the screen S is insufficient, a predetermined warning is output (step S380), and the solder amount estimation process is completed. Here, the process of step S380 is performed by transmitting the warning signal to the management computer 90 using the control device 70, and the management computer 90 which has received the warning signal displays a warning screen which requests that the solder be refilled on the display 98. Note that, when the present disclosure is applied to a screen printer on which an automating supplying device capable of automatically supplying the solder is mounted, the automatic supplying device may be controlled such that the solder is refilled, as appropriate, based on the estimated solder roll width R.

Figure 7:
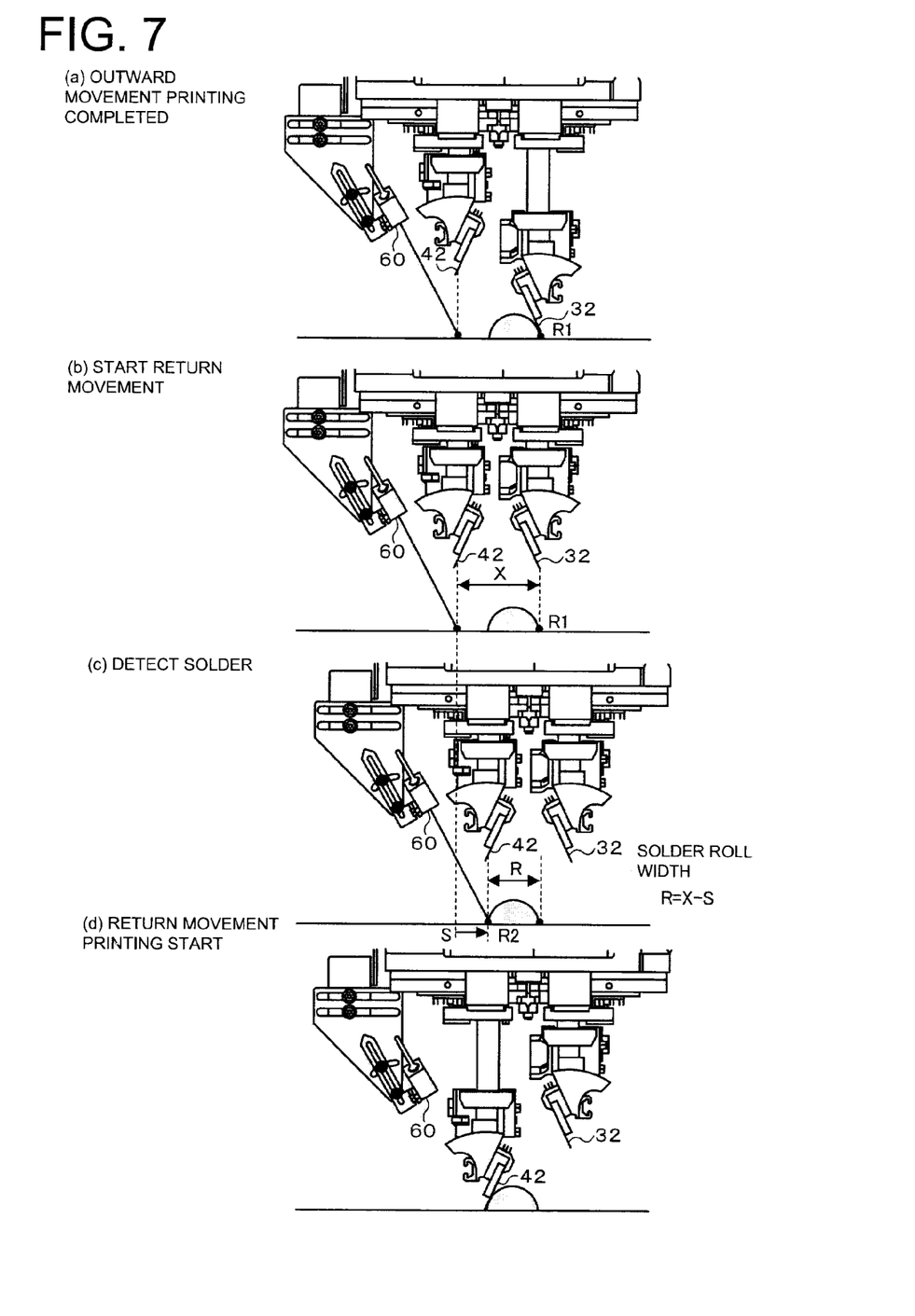
FIG. 7 is an explanatory diagram illustrating states of operation of the screen printer 20 during estimation of a solder roll width R.

FIG. 7 is an explanatory diagram illustrating states of operation of the screen printer 20 during estimation of the solder roll width R. As illustrated, when the outward movement is completed, the right squeegee 32 is in a state of contacting the right end R1 of the solder roll (refer to FIG. 7 (a)). The right squeegee 32 is lifted, and the return movement (movement in the rightward direction in the drawing) of the squeegees 32 and 42 (and the photoelectric sensor 60) is started (refer to FIG. 7 (b)). At this time, the optical axis position of the photoelectric sensor 60 on the screen S is at a position separated by the distance X from below the right squeegee 32, that is, the right end R1 of the solder roll. When the squeegees 32 and 42 (and the photoelectric sensor 60) move until the photoelectric sensor 60 detects the left end R2 of the solder roll (refer to FIG. 7 (c)), the solder roll width R is calculated by subtracting, from the distance X, the movement amount S(=p1−p2) of the squeegees 32 and 42 from when the outward movement printing is completed to when the photoelectric sensor 60 detects the left end R2 of the solder roll. After the solder roll width R is calculated, the next return movement printing is started by lowering the left squeegee 42 and moving the left squeegee 42 in the rightward direction (refer to FIG. 7 (d)). In the present embodiment, since the photoelectric sensor 60 adjusts the optical axis such that the optical axis position on the screen S is positioned below the left squeegee 42, when the photoelectric sensor 60 detects the left end R2 of the solder roll, the left squeegee 42 is positioned above the left end R2 of the solder roll. Therefore, it is possible to cause the left squeegee 42 to contact the left end R2 of the solder roll merely by lowering the left squeegee 42, and it is possible to quickly start the return movement printing.

According to the screen printer 20 of the present embodiment described above, the photoelectric sensor 60 and the squeegees 32 and 42 are fixed to the slider 52, when the outward movement printing in which the solder on the screen S is rolled by the outward movement of the right squeegee 32 is completed, the right squeegee 32 is separated from a state of contacting the right end R1 of the solder roll and the squeegee position p1 at that time is input, and, subsequently, the slider 52 (the photoelectric sensor 60) is returned until the photoelectric sensor 60 detects the left end R2 of the solder roll and the squeegee position p2 at this time is input. The amount (the solder roll width R) of solder remaining on the screen S is calculated by subtracting the movement amount S from the squeegee position p1 to the squeegee position p2 from the distance (the horizontal distance) X from the right squeegee 32 to the optical axis position of the photoelectric sensor 60 on the screen S. Accordingly, since it is possible to render the movement distance (the movement amount S) of the photoelectric sensor 60 necessary for the calculation of the solder roll width R shorter than the movement amount necessary for the photoelectric sensor 60 to pass from the right end R1 to the left end R2 of the solder roll, it is possible to further reduce the required time necessary for the estimation of the solder roll width. As a result, it is possible to increase the execution frequency of the solder amount estimation process without greatly decreasing the printed number per unit time, and it is possible to appropriately manage the solder amount on the screen S. In addition, since optical axis adjustment is performed such that the optical axis position of the photoelectric sensor 60 on the screen S is positioned below the left squeegee 42, when the photoelectric sensor 60 detects the left end R2 of the solder roll, it is possible to position the left squeegee 42 above the left end R2 of the solder roll. Therefore, after executing the solder amount estimation process, it is possible to cause the left squeegee 42 to contact the left end R2 of the solder roll merely by lowering the left squeegee 42, and it is possible to quickly start the return movement printing.

In the screen printer 20 of the present embodiment, the optical axis adjustment is performed such that the optical axis position of the photoelectric sensor 60 on the screen S is positioned below the left squeegee 42; however, it is not necessary to position the optical axis position on the screen S below the left squeegee 42. Although, since it is possible to make the movement distance of the left squeegee 42 to the return movement printing start position shorter the closer the optical axis position on the screen S is to beneath the left squeegee 42, it is possible to reduce the time until the next return movement printing is started.

In the screen printer 20 of the present embodiment, the solder amount estimation process is executed every time the outward movement printing is completed; however, the configuration is not limited thereto, the solder amount estimation process may be executed at any frequency such as executing the solder amount estimation process every time a predetermined number of prints are finished, and changing the timing at which the solder amount estimation process is executed next based on the solder amount which is estimated in the solder amount estimation process (for example, shortening the execution interval of the solder amount estimation process more the less the estimated solder amount).

In the screen printer 20 of the present embodiment, the solder amount is estimated after the outward movement printing is completed; however, the configuration is not limited thereto, the solder amount may be estimated after the return movement printing is completed, and the solder amount may be estimated both after the outward movement printing is completed and after the return movement printing is completed. Note that, when the solder amount is estimated after the return movement printing is completed, the photoelectric sensor may be installed such that the optical axis on the screen S is positioned at a position separated by the distance (the horizontal distance) X from the left squeegee 42 in the return movement direction (the rightward direction).

In the screen printer 20 of the present embodiment, a configuration is adopted in which reciprocating printing is possible due to the two squeegees 32 and 42; however, the configuration is not limited thereto, and a configuration may be adopted in which it is possible to print in only one direction using one squeegee.

In the screen printer 20 of the present embodiment, the screen printing is executed by fixing the screen S to the housing 22 and moving the squeegees 32 and 42 in the vertical direction and the horizontal direction; however, the configuration is not limited thereto, and any configuration may be adopted as long as the configuration is capable of relative movement in the vertical direction and the horizontal direction between the screen S and the squeegees, such as executing the screen printing by fixing the squeegees 32 and 42 to the housing 22 and moving the screen S in the vertical direction and the horizontal direction.

Description will be given of the correspondence relationship between the main elements of the embodiment and the main elements of the disclosure described in the section of Summary. In the embodiment, the squeegees 32 and 42 correspond to a "squeegee", the screen printer 20 corresponds to a "screen printer", the squeegee heads 34 and 44 correspond to a "head", the horizontal movement device 50 corresponds to a "parallel movement device", the lifting and lowering devices 36 and 46 correspond to a "perpendicular movement device", the encoder 59 corresponds to a "position detection device", the photoelectric sensor 60 corresponds to an "optical detection device", the CPU 71 of the control device 70 which executes S140 of the printing process of FIG. 5 and S310 to S330 of the solder amount estimation process of FIG. 6 corresponds to a "printing completion time control device", and the CPU 71 of the control device 70 which executes the processes S300 and S340 to S380 of the solder amount estimation process corresponds to a "solder amount estimation device". The right squeegee 32 corresponds to a "first squeegee", and the left squeegee 42 corresponds to a "second squeegee". Note that, since the embodiment is an example for specifically describing a mode for carrying out the disclosure described in the section of Summary, the correspondence relationship between the main elements of the embodiment and the main elements of the disclosure described in the section of Summary is not limited to elements of the disclosure described in the section of Summary. In other words, the interpretation of the disclosure described in the section of Summary should be carried out based on the description of the section itself, and the embodiment is merely a specific example of the disclosure described in the section of Summary.

Hereinabove, the embodiment for carrying out the present disclosure is described; however, the present disclosure is not limited in any manner to the embodiment, and may be carried out in various modes within a scope that does not depart from the subject matter of the present disclosure.

INDUSTRIAL APPLICABILITY

The present disclosure may be used in the manufacturing industry of screen printers, or the like.

The invention claimed is:

1. A screen printer which performs printing by moving solder which is placed on a screen using a squeegee, the screen printer comprising:
    a head, on which the squeegee is mounted;
    a parallel movement device that causes the head and the screen to move relatively in a direction parallel to the screen;
    a perpendicular movement device that causes the head and the screen to move relatively in a direction perpendicular to the screen;
    position detection device that detects a relative position between the squeegee and the screen;
    optical detection device which is provided such that an optical axis position is capable of moving relative to the screen due to the parallel movement device, and which detects the screen and the solder at the optical axis position in distinction from each other;
    printing completion time control device configured to, when printing is completed, control the perpendicular movement device such that the squeegee and the screen move relatively in a direction perpendicular to the screen to a position at which the squeegee is at least separated from a state of being in contact with one end side of the solder in a printing direction, and, after the controlling is performed, controlling the parallel movement device such that the head and the screen move relatively in a direction parallel to the screen until at least another end side of the solder in the printing direction is detected by the optical detection device; and solder amount estimation device configured to estimate an amount of solder on the screen based on the relative position between the squeegee and the screen which is detected by the position detection device when the printing is completed, and the relative position between the squeegee and the screen which is detected by the position detection device when the other end of the solder in the printing direction is detected by the optical detection device.

2. The screen printer according to claim 1 which, as the squeegee, is provided with a first squeegee and a second squeegee which are disposed such that contact surfaces with the solder face each other, and which repeats an operation of performing printing by causing the first squeegee to contact the solder and causing the head and the screen to move relatively in a first direction, and, after the printing, performing a next printing by causing the second squeegee to contact the solder and causing the head and the screen to move relatively in a second direction which is a reverse of the first direction,
wherein the optical detection device is provided such that, when the printing by the first squeegee is completed and the head and the screen are moved relatively until the other end side of the solder in the printing direction is detected by the optical detection device, the other end side of the solder in the printing direction is positioned in a vicinity below the second squeegee.

* * * * *